(12) United States Patent
Zou et al.

(10) Patent No.: US 11,109,162 B2
(45) Date of Patent: Aug. 31, 2021

(54) MEMS MICROPHONE

(71) Applicant: GOERTEK INC., Shandong (CN)

(72) Inventors: Quanbo Zou, Shandong Province (CN); Zhe Wang, Shandong Province (CN); Jialiang Yan, Shandong Province (CN)

(73) Assignee: GOERTEK INC., Shandong (CN)

( * ) Notice: Subject to any disclaimer, the term of this patent is extended or adjusted under 35 U.S.C. 154(b) by 6 days.

(21) Appl. No.: 16/609,194

(22) PCT Filed: May 5, 2017

(86) PCT No.: PCT/CN2017/083306
§ 371 (c)(1),
(2) Date: Oct. 28, 2019

(87) PCT Pub. No.: WO2018/201471
PCT Pub. Date: Nov. 8, 2018

(65) Prior Publication Data
US 2020/0092658 A1    Mar. 19, 2020

(51) Int. Cl.
*H04R 19/04* (2006.01)
*B81B 7/00* (2006.01)
(Continued)

(52) U.S. Cl.
CPC ........... *H04R 19/04* (2013.01); *B81B 7/0058* (2013.01); *H04R 1/04* (2013.01); *H04R 19/005* (2013.01);
(Continued)

(58) Field of Classification Search
CPC ............... H04R 19/04; H04R 19/0257; H04R 2410/03; B81B 2201/003; B81B 2201/0257
See application file for complete search history.

(56) References Cited

U.S. PATENT DOCUMENTS

2010/0195864 A1    8/2010 Lutz et al.
2018/0215609 A1*   8/2018 Agashe ............... B81C 1/00285
(Continued)

FOREIGN PATENT DOCUMENTS

CN    201509291 U    6/2010
CN    201854425 U    6/2011
(Continued)

*Primary Examiner* — Sunita Joshi
(74) *Attorney, Agent, or Firm* — LKGlobal | Lorenz & Kopf, LLP

(57) ABSTRACT

A MEMS microphone, comprising a packaging structure that is enveloped by a PCB substrate (1) and a housing (2), wherein the packaging structure is provided with a MEMS acoustoelectric chip (3) therein, and the PCB substrate (1) is provided with a sound port (11) at a position that is corresponding to the MEMS acoustoelectric chip (3), wherein, the MEMS microphone further comprises a filter (5), wherein the filter (5) is embedded into a back cavity of the MEMS acoustoelectric chip (3), the filter (5) and the PCB substrate (1) have a lateral hole therebetween, and the lateral hole serves as a sound channel that is used by the MEMS acoustoelectric chip (3) to gather sound. The MEMS microphone can prevent gas shock, block the interfering to the MEMS microphone by kinetic particles, keep the acoustic performance of the MEMS microphone, and reduce the packaging size of the MEMS microphone.

14 Claims, 5 Drawing Sheets

(51) Int. Cl.
*H04R 1/04* (2006.01)
*H04R 19/00* (2006.01)

(52) U.S. Cl.
CPC ............... *B81B 2201/0257* (2013.01); *H04R 2201/003* (2013.01); *H04R 2410/03* (2013.01)

(56) References Cited

U.S. PATENT DOCUMENTS

2018/0220216 A1* 8/2018 Agashe ................. B81B 3/0089
2018/0376254 A1* 12/2018 Pal ........................... B81B 3/00

FOREIGN PATENT DOCUMENTS

| | | | |
|---|---|---|---|
| CN | 202425037 U | | 9/2012 |
| CN | 203193895 U | | 9/2013 |
| CN | 203225885 U | * | 10/2013 |
| CN | 203225885 U | | 10/2013 |
| CN | 203225886 U | | 10/2013 |
| CN | 103581814 A | | 2/2014 |
| CN | 203748007 U | | 7/2014 |
| CN | 204442602 U | | 7/2015 |
| CN | 204675827 U | | 9/2015 |
| CN | 204929255 U | | 12/2015 |
| CN | 206100450 U | | 4/2017 |

* cited by examiner

MEMS MICROPHONE

CROSS-REFERENCE TO RELATED APPLICATION

This Application is a U.S. National-Stage entry under 35 U.S.C. § 371 based on International Application No. PCT/CN2017/083306, filed May 5, 2017 which was published under PCT Article 21(2) and which is hereby incorporated in its entirety by reference.

TECHNICAL FIELD

This application pertains to the field of acoustic-electric transition, and particularly relates to a MEMS microphone.

BACKGROUND

Along with the advance of the society and the development of electronic technology, electronic products such as mobile telephone are becoming increasingly important in the daily life of people, and are nearly requisites that people need to carry all the time. In electronic products such as mobile telephone, in order to realize functions such as phone call, microphones are required to gather sound signals. In order to adapt for the performance requirements and the development trend of miniaturization of electronic products, MEMS (Micro-Electro-Mechanical System) microphones are usually employed. MEMS microphones are packaging structures that comprise a housing and a printed circuit board (PCB for short). A MEMS acoustoelectric chip is provided on the surface of the printed circuit board in the packaging structure, and the printed circuit board is provided with a sound port for receiving sound signals at the position facing the MEMS acoustoelectric chip. Ambient sounds act on the MEMS acoustoelectric chip via the sound port to realize the sound inputting effect. Because the MEMS acoustoelectric chip is directly facing the sound port, when the gas flow that enters the sound port is relatively large, the relatively large gas flow directly acts on the MEMS acoustoelectric chip, and impacts the diaphragm of the MEMS acoustoelectric chip to a certain extend, which, in severe situations, may damage the diaphragm on the MEMS acoustoelectric chip, affect the performance of the MEMS acoustoelectric chip, and thus affect the overall performance of the MEMS microphone.

The Chinese patent for utility model (publication number CN 203225885 U) discloses a MEMS microphone. As shown in FIG. 1, in the MEMS microphone, within a packaging structure that is enveloped by a PCB substrate 1 and a housing 2, the surface of the PCB substrate 1 is provided with a protection interposer 4 that can cover the sound port 11, and the protection interposer 4 and the PCB substrate 1 envelope a first acoustic cavity 10; a MEMS acoustoelectric chip 3 is provided on the protection interposer 4, and envelopes together with the protection interposer 4 a second acoustic cavity 20; the protection interposer 4 is provided with two or more communicating apertures 40; the aperture sizes of the communicating apertures 40 are smaller than the aperture size of the sound port 11; and the first acoustic cavity 10 is in communication with the second acoustic cavity 20 via the communicating apertures 40. Although the MEMS microphone is provided with the protection interposer to prevent the impacting to the MEMS acoustoelectric chip by ambient gas flows, the larger size of the protection interposer than that of the MEMS acoustoelectric chip restricts the packaging size of the MEMS microphone, which is adverse to miniaturization design. In addition, the aperture sizes of the communicating apertures of the protection interposer is smaller than the aperture of the sound port, and have big acoustic resistance, which seriously reduces the signal-to-noise ratio of the MEMS microphone, and affects the acoustic performance of the MEMS microphone.

Furthermore, the MEMS microphones of the prior art lack anti-interference designs regarding electromagnetics, radio frequency, light and suspended particles, so, in the process of manufacturing and using, those factors will interfere and affect the MEMS microphones, which degrades the performance and the stability of the MEMS microphones. In addition, other objects, desirable features and characteristics will become apparent from the subsequent summary and detailed description, and the appended claims, taken in conjunction with the accompanying drawings and this background.

SUMMARY

An object of the present disclosure is to provide a MEMS microphone, to improve the prior art and solve one or more of the above technical problems in the prior art.

In order to realize the above object, different embodiments individually teach the following multiple technical solutions:

A MEMS microphone, comprising a packaging structure that is enveloped by a PCB substrate and a housing, wherein the packaging structure is provided with a MEMS acoustoelectric chip therein, and the PCB substrate is provided with a sound port at a position that is corresponding to the MEMS acoustoelectric chip, wherein, the MEMS microphone further comprises a filter, and the filter is embedded into a back cavity of the MEMS acoustoelectric chip, the filter and the PCB substrate have a lateral hole therebetween, and the lateral hole serves as a sound channel that is used by the MEMS acoustoelectric chip to gather sound wherein the filter comprises a top plate and a bottom anchor that are connected together; the top plate is directly facing the sound port; and the bottom anchor supports the top plate, and is electrically connected to the PCB substrate, and the top plate and the PCB substrate have the lateral hole therebetween.

Optionally, the filter is electrically conductive, and is electrically connected to the PCB substrate to be grounded.

Optionally, the filter comprises a base body that is made of a non-electrically conductive material, and the base body is provided with an electrically conductive layer thereon; or, the filter is wholly made of an electrically conductive material.

Optionally, the filter is electrically conductively adhered on the PCB substrate by an electrically conductive adhesive, and is connected to the ground of the PCB substrate.

Optionally, a height of the lateral hole that is between the filter and the PCB substrate is 25-200 micrometers.

Optionally, the height of the lateral hole that is between the filter and the PCB substrate is 50-100 micrometers.

Optionally, the filter comprises a top plate and a bottom anchor that are connected together; the top plate is directly facing the sound port; and the bottom anchor supports the top plate, and is electrically connected to the PCB substrate, and the top plate and the PCB substrate have the lateral hole therebetween.

Optionally, a thickness of the filter is 100-300 micrometers.

Optionally, the thickness of the filter is 150-200 micrometers.

Optionally, the bottom anchor of the filter is a plurality of bottom anchors that are separately arranged, the plurality of bottom anchors that are separately arranged have notches therebetween, and the notches form the lateral hole;

or, the bottom anchor of the filter is bottom anchors that are connected to be integral, the bottom anchors that are connected to be integral have notches on one side, and the notches form the lateral hole.

Optionally, the lateral hole is further provided with a filtering screen, and the filtering screen is formed by pillars on the top plate of the filter.

Optionally, the top plate of the filter is provided with a row of the pillars, to form the filtering screen of a single-layer structure.

Optionally, the top plate of the filter is provided with a plurality of rows of the pillars, and the plurality of rows of the pillars are arranged interleavingly, to form the filtering screen of a multiple-layer structure.

Optionally, the space between adjacent pillars forms a diameter-varying channel, and the diameter-varying channel tends to be linear at the most narrow position in the direction of sound propagation.

Optionally, the cross-sectional shape of the pillars is star-shaped, diamond-shaped or round.

Optionally, widths of gaps that are formed between the pillars are 5-100 micrometers.

Optionally, the housing of the MEMS microphone is an electrically conductive body, and is electrically connected to the ground of the PCB substrate; and the housing, the PCB substrate and the filter form a grounded casing.

The MEMS microphone of the present disclosure, by embedding the filter into the back cavity cavity of the MEMS acoustoelectric chip, by using the lateral hole between the filter and the PCB substrate, realizes the gathering of sound signals, which can prevent gas shock, block the interfering to the MEMS microphone by kinetic particles, keep the acoustic performance of the MEMS microphone, and reduce the packaging size of the MEMS microphone.

BRIEF DESCRIPTION OF THE DRAWINGS

The present invention will hereinafter be described in conjunction with the following drawing figures, wherein like numerals denote like elements, and.

Figure 1:
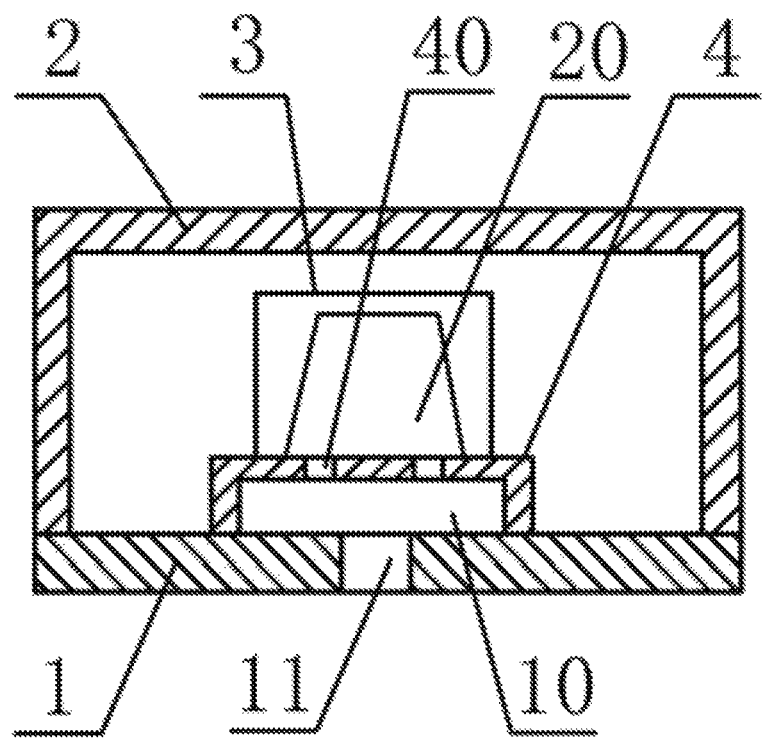
FIG. 1 is the schematic diagram of the structure of a MEMS microphone in the prior art.

In the drawings: 1 refers to the PCB substrate; 11 the sound port; 2 the housing; 3 the MEMS acoustoelectric chip; 4 the protection interposer; 40 the communicating aperture; 5 the filter; 6 the ASIC chip; 7 the electrically conductive adhesive layer; 8 the adhesive layer; 9 the grounded bonding pad; 10 the first acoustic cavity; 20 the second acoustic cavity; 51 the top plate; 52 the bottom anchor; and 53 pillars.

DETAILED DESCRIPTION

The following detailed description is merely exemplary in nature and is not intended to limit the invention or the application and uses of the invention. Furthermore, there is no intention to be bound by any theory presented in the preceding background of the invention or the following detailed description.

In order to make the objects, the technical solutions and the advantages of the present disclosure clearer, the embodiments of the present disclosure will be described below in further detail in conjunction with the drawings.

Figure 2:
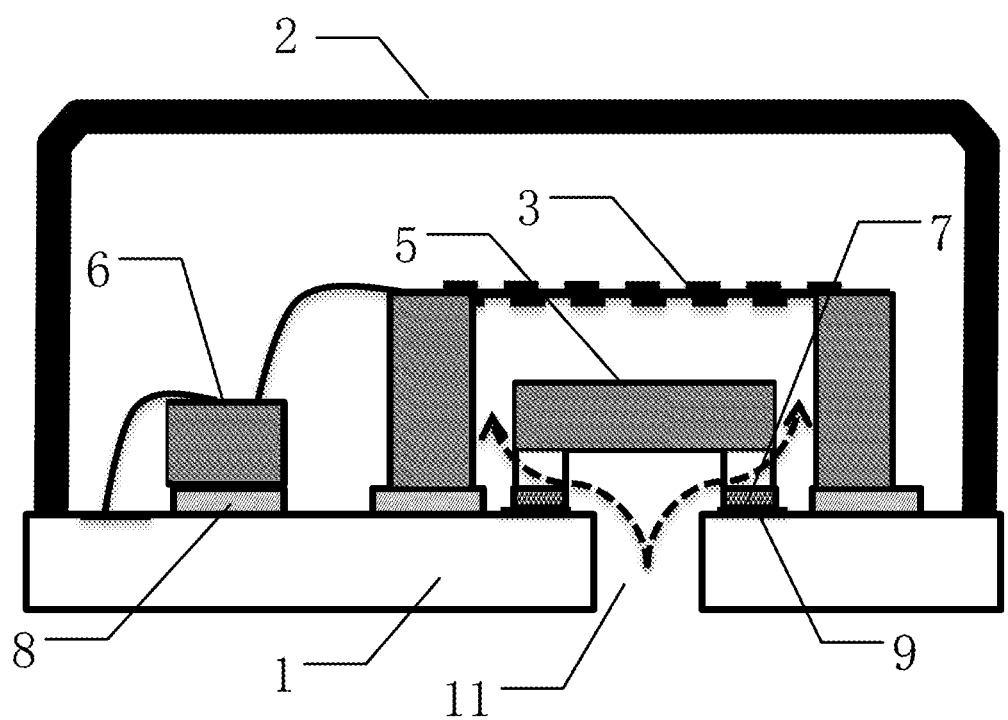
FIG. 2 is the schematic diagram of the structure of a MEMS microphone that is provided by an embodiment of the present disclosure.

FIG. 2 is the schematic diagram of the structure of a MEMS microphone that is provided by an embodiment of the present disclosure. As shown in FIG. 2, the MEMS microphone of the present disclosure comprises a packaging structure that is enveloped by a PCB substrate 1 and a housing 2. The packaging structure is provided with a MEMS microphone 3 therein. One end of the housing 2 is open. The PCB substrate 1 basically seals the open side of the housing 2. The PCB substrate 1 is provided with a sound port 11 at the position that is corresponding to a MEMS acoustoelectric chip 3. The MEMS microphone further comprises a filter 5. The filter 5 is embedded into a back cavity of the MEMS acoustoelectric chip 3. The filter 5 and the PCB substrate 1 have a lateral hole therebetween, and the lateral hole serves as a sound channel that is used by the MEMS acoustoelectric chip 3 to gather sound. When the MEMS microphone of the present disclosure is operating, the path that the gas flow flows through is as shown by the dotted arrow in the figure.

The MEMS microphone of the present disclosure, by embedding the filter 5 into the back cavity of the MEMS acoustoelectric chip 3, by using the lateral hole between the filter 5 and the PCB substrate 1, realizes the gathering of sound signals, so that the strong gas flow that enters from the sound port 11 of the PCB substrate 1 is blocked, and in turn enters via the sound channel of the lateral hole, thereby preventing the impact of the gas flow to the capacitive diaphragm of the MEMS acoustoelectric chip 3, improving the robustness of the MEMS microphone against falling and gas impacting, and improving the yield and the operational reliability of the MEMS microphone. Additionally, the blocking and turning of the gas flow by the filter 5 can also block the interfering of kinetic particles to the MEMS microphone, because, in manufacturing high-performance MEMS microphones, from packaging and surface placing to the last link of the production line, the MEMS acoustoelectric chip 3 may be polluted by particulate matters, which degrades the acoustic performance of the MEMS microphones and affects the product quality, but embedding the filter 5 into the back cavity of the MEMS acoustoelectric chip can prevent particulate matters from entering along with the gas flow from the sound port 11 as far as possible by the blocking, thereby improving the anti-interference performance of the MEMS microphone to particulate matters. Furthermore, the employing of the filter 5 of the embedded structure can decrease the packaging size, to enable the MEMS microphone to have a smaller volume, and additionally the sound channel of the lateral hole between the filter 5 and the PCB substrate is larger than the apertures of the prior art, and especially can be easily made to have approximately the same size as that of the sound port 11, or even bigger than the sound port 11, which can greatly reduce the acoustic resistance in the sound transmission process, and decrease the impact to the acoustic performance of the MEMS microphone. A person skilled in the art knows that, the lateral dimension of the filter 5 is preferably greater than the diameter of the sound port 11, to cover the sound port 11 and block the gas flow, but is smaller than the inner diameter of the back cavity of the MEMS acoustoelectric chip 3, to be embedded into the back cavity of the MEMS acoustoelectric chip 3.

Figure 3:
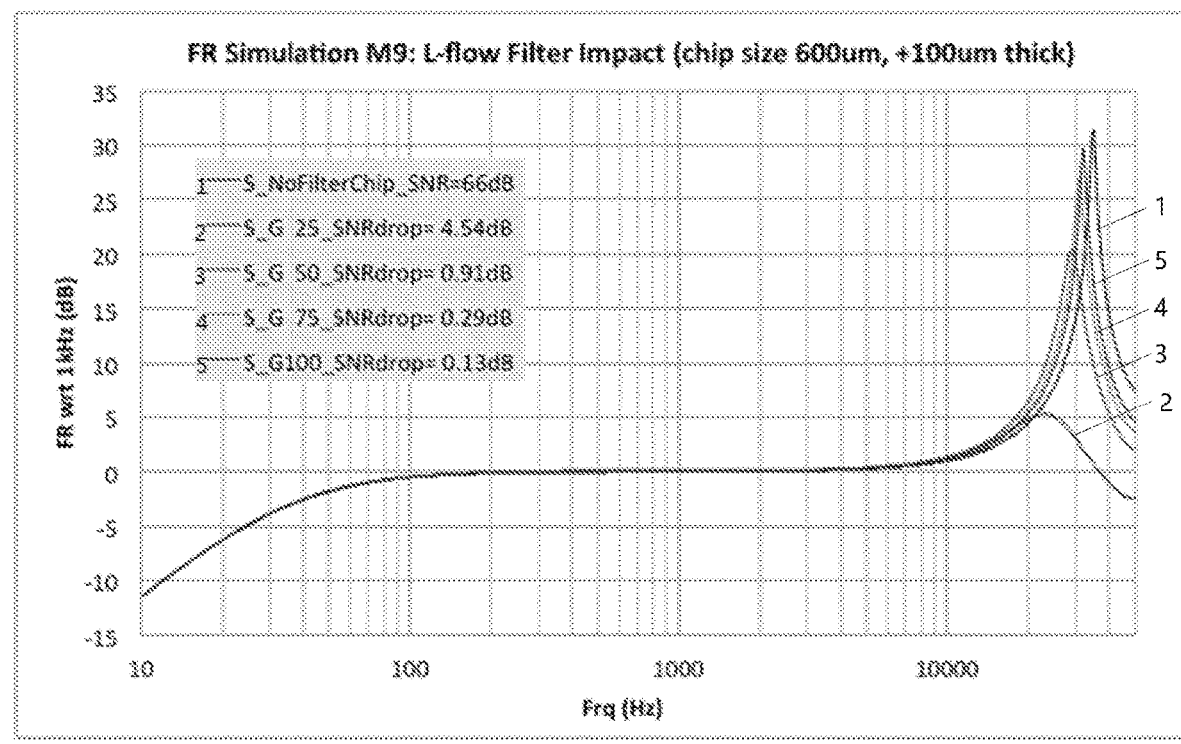
FIG. 3 is the simulated effect diagram of the frequency response curve of the MEMS microphone of the present disclosure.

FIG. 3 shows the simulated effect diagram of the frequency response curve of the MEMS microphone of the present disclosure. The curves in the figure individually show the sensitivities of the MEMS microphone with different structure designs. The first curve marked in the figure indicates the frequency response when the filter is not provided, and the second to the fifth curves marked in the figure individually indicate the frequency response when filters of different sizes are provided, wherein, the heights of the lateral holes between the filter and the PCB substrate are successively 25 μm, 50 μm, 75 μm and 100 μm. It can be seen from the figures that, when the filter is not provided, the MEMS microphone has the smallest acoustic resistance and the highest signal-to-noise ratio, of 66 dB, and when the filter is added, because of the increasing of the acoustic resistance, the signal-to-noise ratio of the MEMS microphone is reduced, and the obvious influence on the signal-to-noise ratio is generated mainly in the high-frequency region. It can be known from the simulated frequency responses shown by the second to the fifth curves that, the reduced quantities of their signal-to-noise ratios are respectively 4.54 dB, 0.91 dB, 0.29 dB and 0.13 dB. It can be seen that, if the size of the lateral hole between the filter and the PCB substrate is larger, the acoustic resistance is smaller, and the performance of the MEMS microphone is better. In that, when the height of the lateral hole reaches 75 μm and 100 μm, the loss of the signal-to-noise ratio is smaller than 0.5 dB, which indicates a high acoustic performance.

On the basis of the result of the above simulation experiment, Preferably, the height of the lateral hole that is between the filter 5 and the PCB substrate 1 is 25-200 micrometers. More preferably, the height of the lateral hole that is between the filter 5 and the PCB substrate 1 is 50-100 micrometers. The lateral hole with the above heights cannot only satisfy the requirement on the MEMS microphone of the present disclosure of preventing gas shock and filtering particulate matters, but also satisfy the requirement on the acoustic performance of the MEMS microphone.

Preferably, as shown in FIG. 2, the PCB substrate 1 is further provided with an ASIC chip 6 thereon, and the ASIC chip 6 is connected to the MEMS acoustoelectric chip 3. The MEMS acoustoelectric chip 3 comprises an elastic diaphragm, a rigid perforated back electrode and a base. The elastic diaphragm and the rigid perforated back electrode form a capacitor, and the elastic diaphragm senses the variation of the sound pressure, and converts the sound signals to the variation of the capacitance. In turn, the ASIC chip 6 connected to the MEMS acoustoelectric chip 3 converts the variation of the capacitance to electrical signal outputs, to realize the conversion from the sound signals to electrical signals.

Preferably, the filter 5 is electrically conductive, and is electrically connected to the PCB substrate 1 to be grounded. Because the processes of the manufacturing and the use of the MEMS microphone may be interfered by electromagnetics, radio frequency and optical signals (such as visible light, infrared light and ultraviolet light), in the present disclosure, the filter 5 is configured to be an electrically conductive structure, and is connected to the ground of the PCB substrate 1, and the filter 5 that is grounded forms a shielding layer, to realize the shielding on electromagnetics, radio frequency and optical interferences, to further improve the anti-interference performance and the stability of the MEMS microphone of the present disclosure.

Preferably, the filter 5 is configured to be a surface conductive structure, comprising a base body that is made of a non-electrically conductive material, and an electrically conductive layer provided on the base body, wherein the electrically conductive layer implements the surface conducting of the filter 5. In that, the base body may be made of common materials such as silicon, FR4, glass, polymer, plastics and ceramics, with the electrically conductive layer coated thereon, or, the filter 5 is configured to be a wholly electrically conductive structure, and may be wholly made of an electrically conductive material, such as an electrically conductive metal or alloy, to realize the wholly electrically conducting of the filter 5.

Preferably, the filter 5 is electrically conductively adhered on the PCB substrate 1 by an electrically conductive adhesive, and is connected to the ground of the PCB substrate 1. As shown in FIG. 2, the lower part of the filter 5 is electrically conductively connected to a grounded bonding pad 9 on the PCB substrate 1 by an electrically conductive adhesive layer 7 to realize the grounding, the MEMS acoustoelectric chip 3 and the ASIC chip 6 are fixed on the PCB substrate 1 by adhering with a common adhesive layer 8, and the electric connection between the MEMS acoustoelectric chip 3, the ASIC chip 6 and the PCB substrate 1 are realized by lead wires.

Figure 4:
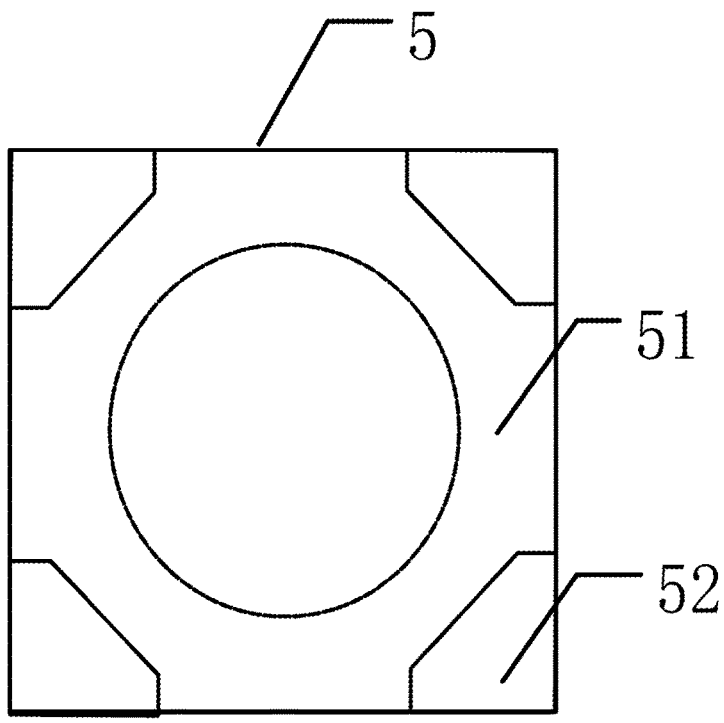
FIG. 4 is the bottom view of a filter that has separated bottom anchors.

FIG. 4 shows the bottom view of a filter that is used by the MEMS microphone of the present disclosure, and the round dotted line in the figure represents the projection of the sound port 11 on the filter 5. As shown in FIG. 4, the filter 5 comprises a top plate 51 and a bottom anchor 52 that are connected together; the top plate 51 is directly facing the sound port 11, to block the gas flow that enters from the sound port 11; and the bottom anchor 52 supports the top plate 51, to fix it, and is electrically conductively connected to the PCB substrate 1. The top plate 51 and the PCB substrate 1 have a lateral hole therebetween, and in the filter 5 shown in FIG. 4, the bottom anchor 52 is a plurality of bottom anchors 52 that are separately arranged, the plurality of bottom anchors 52 that are separately arranged have notches therebetween, and the notches form the lateral hole. In order to make the lateral sound channel, that is, the notches, as large as possible, on the premise of ensuring the reliable fixing, apparently, the area that the bottom anchors 52 occupy should be as small as possible.

Figure 5:
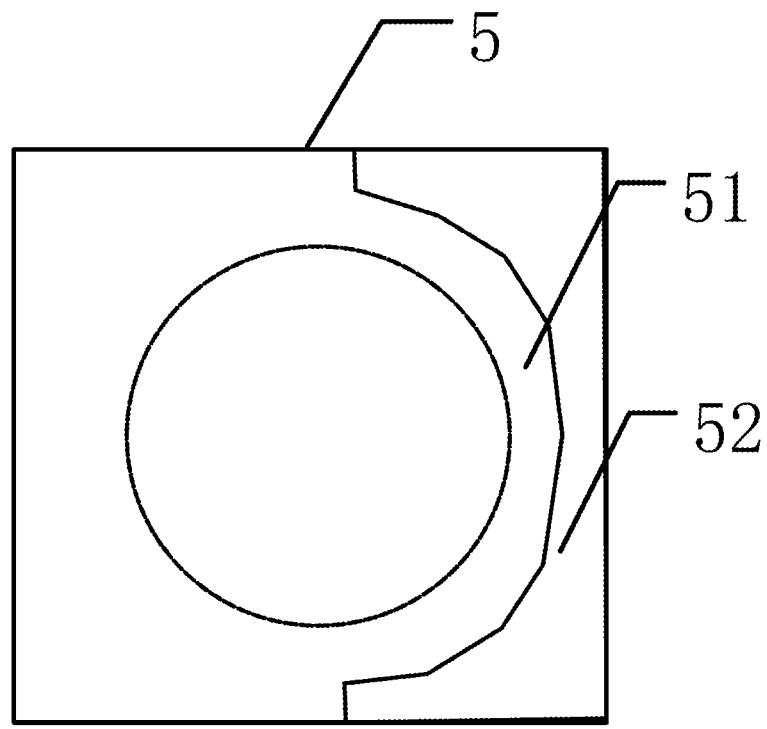
FIG. 5 is the bottom view of a filter that has integral bottom anchors.
Figure 6:
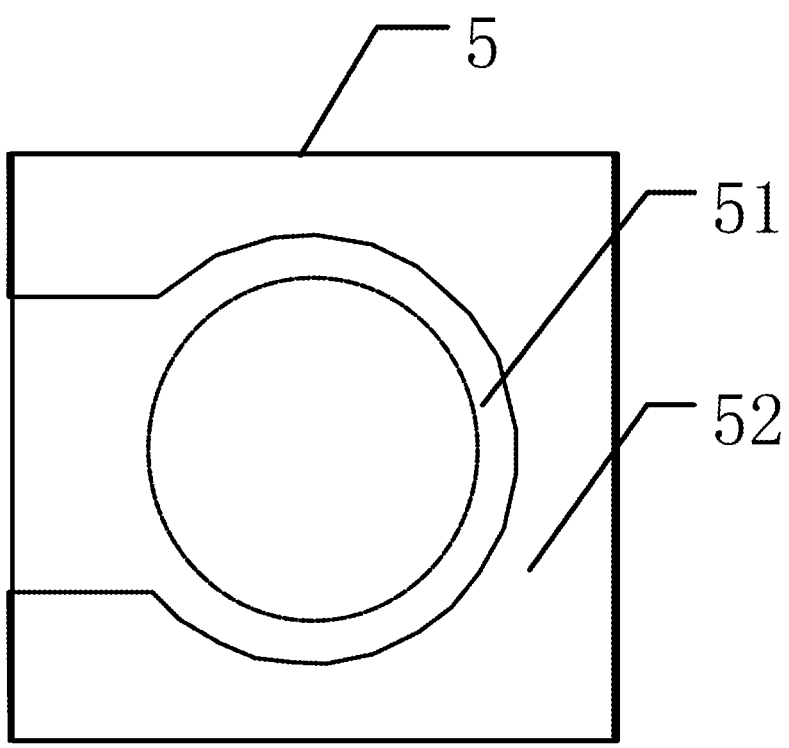
FIG. 6 is the bottom view of another filter that has integral bottom anchors.

FIG. 5 and FIG. 6 individually show the bottom views of another two filters that are used by the MEMS microphone of the present disclosure. In FIG. 5 and FIG. 6, the bottom anchor 52 of the filter 5 is bottom anchors 52 that are connected to be integral, the bottom anchors 52 that are connected to be integral have notches on one side, and the notches form the lateral hole. In FIG. 5, the bottom anchors 52 are provided in the area of the right half of the filter 5, and the left side is left empty, to form the lateral hole. However, in FIG. 6, the bottom anchors 52 envelope generally all of the above regions of the filter 5, and leave the notches in the middle of its left side, to form the lateral hole.

Preferably, the overall thickness of the filter 5 is 100-300 micrometers. More preferably, the overall thickness of the filter 5 is 150-200 micrometers. The above thicknesses cannot only satisfy the requirement on the height of the sound channel of the lateral hole, but also limit the height of the filter 5, so that the top of the filter 5 and the MEMS acoustoelectric chip 3 have a distance large enough therebetween, and form a back acoustic cavity large enough, thereby improving the acoustic performance of the MEMS microphone.

Figure 7:
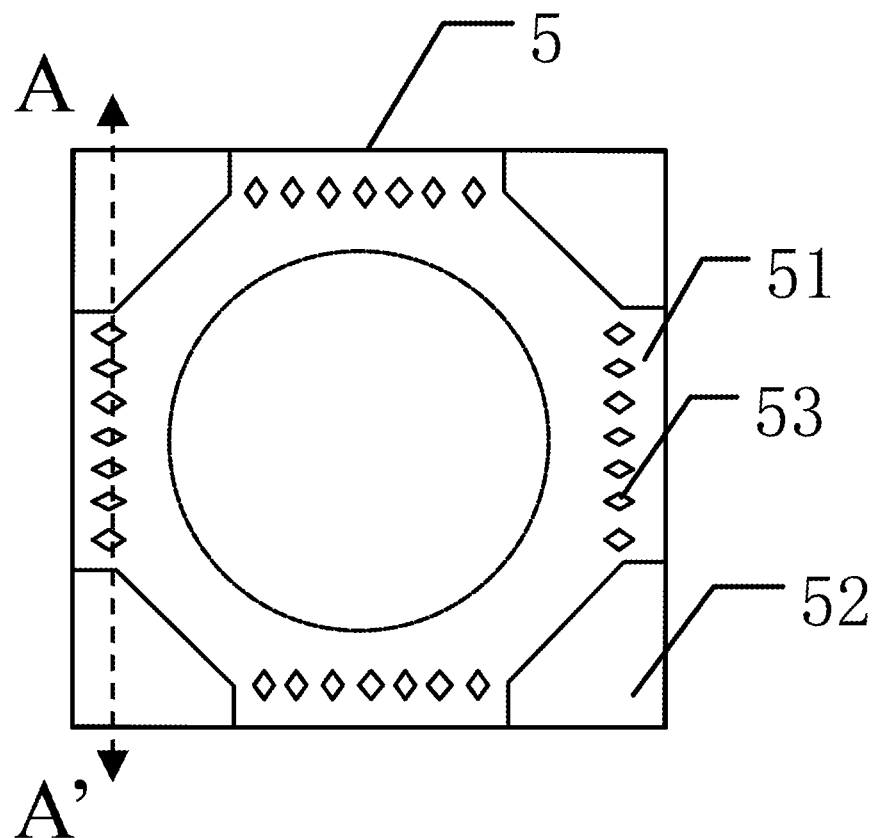
FIG. 7 is the bottom view of a filter that has pillars.

Preferably, in an embodiment of the present disclosure, the lateral hole between the filter 5 and the PCB substrate 1 is further provided with a filtering screen, and the filtering screen is formed by pillars 53 that are provided on the top plate 51 of the filter 5. For example, FIG. 7 shows the bottom view of a filter 5 that has the above pillars 53. As shown in FIG. 7, the bottom anchors 52 of the filter 5 are provided with the pillars 53 that have high aspect ratios at the notches, and those pillars 53 make up the filtering screen for filtering gas flows. Filtering gas flows by the filtering screen can further improve the filtering of particulate matters, and, for example, it can filter particulate matters bigger than several micrometers. The method of forming the pillars 53 is not limited, and, for example, the pillars 53 may be formed on the top plate 51 by Deep Reactive Ion Etching (DRIE).

Figure 8:
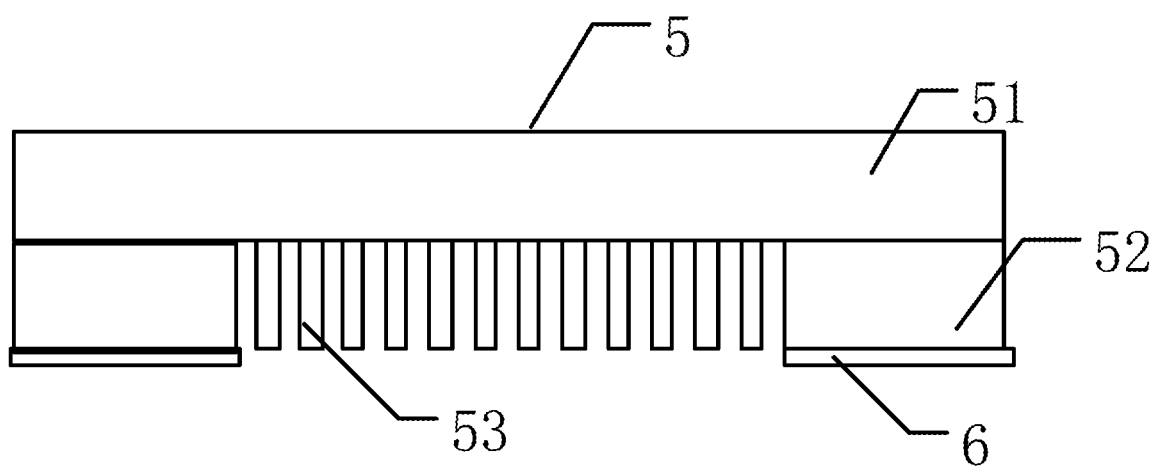
FIG. 8 is the schematic cross section of the position A-A' in FIG. 7.

FIG. 8 is the schematic cross section of the position A-A' in FIG. 7. As shown in FIG. 8, the filtering screen that is formed by the pillars 53 intercepts in the sound channel of the lateral hole, to realize the further filtering of the particulate matters.

Figure 9:
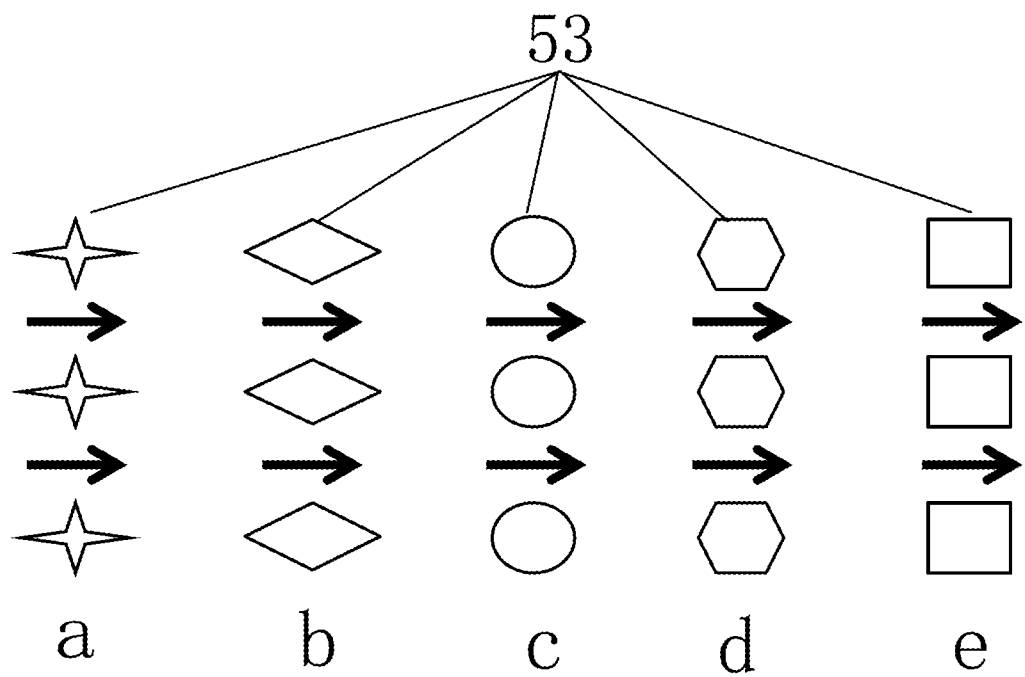
FIG. 9 is the schematic diagram of the gas flow circulation when the filter forms a single layer of filtering screen.

FIG. 9 shows five pillars of different cross-sectional shapes, wherein the arrows indicate the gas flow directions. As shown by the a-e in FIG. 9, the cross-sectional shapes of the pillars 53 are successively star-shape a, diamond-shape b, round c, regular hexagon d and rectangle e.

In that, preferably, the space between adjacent pillars 53 forms a diameter-varying channel, and the diameter-varying channel tends to be linear at the most narrow position in the direction of sound propagation. As shown by the star-shape a, the diamond-shape b and the round c in FIG. 9, the most narrow position of the diameter-varying channel that is formed by the pillars 53 arranged in this way can filter the particles in the gas flow. In addition, the two sides of the diameter-varying channel expand outwardly, which facilitates gas flows passing through, and thus can reduce the acoustic resistance and decrease the influence by the filtering screen on the signal-to-noise ratio of the MEMS microphone.

FIG. 9 shows the schematic diagram of the gas flow circulation when the filter 5 forms a single layer of filtering screen. As shown in FIG. 9, on the top plate 51 of the filter 5 there is only one row of the pillars 53, to form the filtering screen of a single-layer structure.

Figure 10:
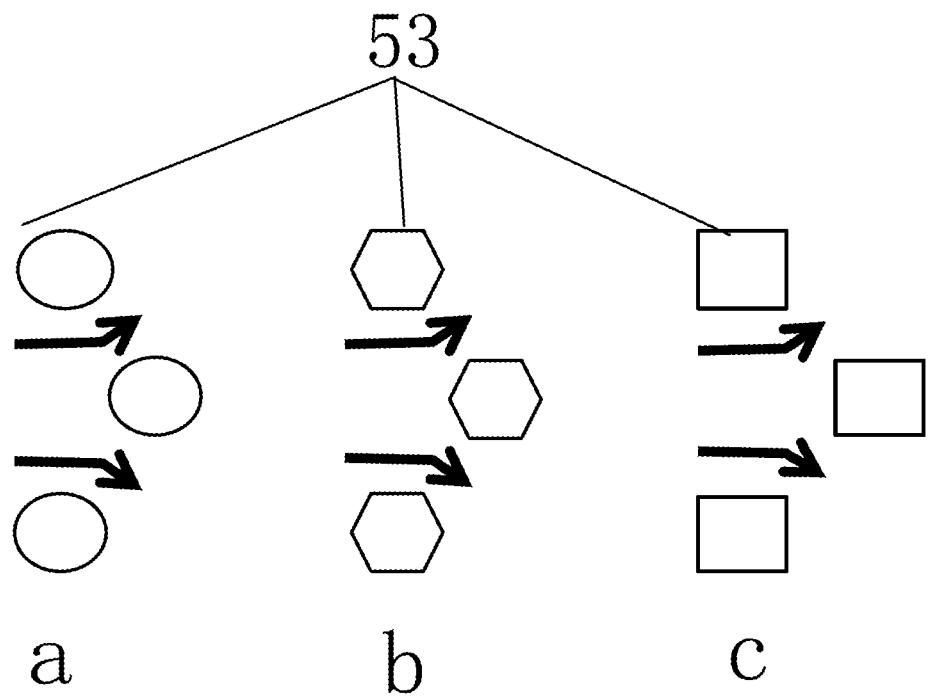
FIG. 10 is the schematic diagram of the gas flow circulation when the filter forms multiple layers of filtering screens.

FIG. 10 shows the schematic diagram of the gas flow circulation when the filter forms multiple layers of filtering screens. As shown in FIG. 10, the top plate 51 of the filter 5 is provided with a plurality of rows of pillars 53 thereon, and the plurality of rows of the pillars 53 are arranged interleavingly, to form the filtering screen of a multiple-layer structure. FIG. 10 shows the pillars 53 of three cross-sectional shapes of round a, regular hexagon b and rectangle c. By referring to the gas flow directions shown by the arrows in the figure, the plurality of rows of the pillars 53 that are arranged interleavingly extend the slit channel for the filtering screen filtering gas flows, and thus can realize better filtering function.

Preferably, the widths of the gaps that are formed between the pillars 53 are 5-100 micrometers, to filter the particulate matters that will interfere the MEMS microphone in the manufacturing process.

Preferably, in an embodiment of the present disclosure, the housing 2 of the MEMS microphone is an electrically conductive body, and the electrically conductive housing 2 is electrically connected to the ground of the PCB substrate 1. Therefore, the housing 2, the PCB substrate 1 and the filter form a grounded casing, and the MEMS acoustoelectric chip 3 is enveloped in the grounded casing, to realize excellent anti-interference effect against electromagnetics, radio frequency and optical signals.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment, it being understood that various changes may be made in the function and arrangement of elements described in an exemplary embodiment without departing from the scope of the invention as set forth in the appended claims and their legal equivalents.

What is claimed is:

1. A MEMS microphone, comprising a packaging structure that is enveloped by a PCB substrate and a housing, wherein the packaging structure is provided with a MEMS acoustoelectric chip therein, and the PCB substrate is provided with a sound port at a position that is corresponding to the MEMS acoustoelectric chip, wherein, the MEMS microphone further comprises a filter, and the filter is embedded into a back cavity of the MEMS acoustoelectric chip, the filter and the PCB substrate have a lateral hole therebetween, and the lateral hole serves as a sound channel that is used by the MEMS acoustoelectric chip to gather sound;

wherein, the filter comprises a top plate and a bottom anchor that are connected together; the top plate is directly facing the sound port; and the bottom anchor supports the top plate, and is electrically connected to the PCB substrate, and the top plate and the PCB substrate have the lateral hole therebetween, wherein, the lateral hole is further provided with a filtering screen, and the filtering screen is formed by pillars on the top plate of the filter, wherein, the top plate of the filter is provided with a row of the pillars, to form the filtering screen of a single-layer structure.

2. The MEMS microphone according to claim 1, wherein, the filter is electrically conductive, and is electrically connected to the PCB substrate to be grounded.

3. The MEMS microphone according to claim 2, wherein, the filter comprises a base body that is made of a non-electrically conductive material, and the base body is provided with an electrically conductive layer thereon; or, the filter is wholly made of an electrically conductive material.

4. The MEMS microphone according to claim 2, wherein, the filter is electrically conductively adhered on the PCB substrate by an electrically conductive adhesive, and is connected to the ground of the PCB substrate.

5. The MEMS microphone according to claim 1, wherein, a height of the lateral hole that is between the filter and the PCB substrate is 25-200 micrometers.

6. The MEMS microphone according to claim 5, wherein, the height of the lateral hole that is between the filter and the PCB substrate is 50-100 micrometers.

7. The MEMS microphone according to claim 1, wherein, a thickness of the filter is 100-300 micrometers.

8. The MEMS microphone according to claim 1, wherein, the thickness of the filter is 150-200 micrometers.

9. The MEMS microphone according to claim 1, wherein, the bottom anchor of the filter is a plurality of bottom anchors that are separately arranged, the plurality of bottom anchors that are separately arranged have notches therebetween, and the notches form the lateral hole;

or, the bottom anchor of the filter is bottom anchors that are connected to be integral, the bottom anchors that are connected to be integral have notches on one side, and the notches form the lateral hole.

10. The MEMS microphone according to claim 1, wherein, the top plate of the filter is provided with a plurality of rows of the pillars, and the plurality of rows of the pillars are arranged interleavingly, to form the filtering screen of a multiple-layer structure.

11. The MEMS microphone according to claim 1, wherein, the space between adjacent pillars forms a diameter-varying channel, and the diameter-varying channel tends to be linear at the most narrow position in the direction of sound propagation.

12. The MEMS microphone according to claim 11, wherein, the cross-sectional shape of the pillars is star-shaped, diamond-shaped or round.

13. The MEMS microphone according to claim 1, wherein, widths of gaps that are formed between the pillars are 5-100 micrometers.

14. The MEMS microphone according to claim 2, wherein, the housing of the MEMS microphone is an electrically conductive body, and is electrically connected to the ground of the PCB substrate; and the housing, the PCB substrate and the filter form a grounded casing.

* * * * *

UNITED STATES PATENT AND TRADEMARK OFFICE
CERTIFICATE OF CORRECTION

PATENT NO. : 11,109,162 B2
APPLICATION NO. : 16/609194
DATED : August 31, 2021
INVENTOR(S) : Quanbo Zou, Zhe Wang and Jialiang Yan Page 1 of 1

It is certified that error appears in the above-identified patent and that said Letters Patent is hereby corrected as shown below:

On the Title Page

Column 1, replace the Applicant name reading:
GOERTEK INC. Shandong N/A CN
With:
WEIFANG GOERTEK MICROELECTRONICS CO., LTD. Shandong CN Column 1, replace the Assignee name reading:
GOERTEK INC. Shandong N/A CN
With:
WEIFANG GOERTEK MICROELECTRONICS CO., LTD. Shandong CN Signed and Sealed this
Eleventh Day of October, 2022

Katherine Kelly Vidal
*Director of the United States Patent and Trademark Office*